United States Patent [19]
Gorbics et al.

[11] Patent Number: 5,838,754
[45] Date of Patent: Nov. 17, 1998

[54] VERNIER DELAY LINE INTERPOLATOR AND COARSE COUNTER REALIGNMENT

[75] Inventors: Mark S. Gorbics, Franklin Lakes, N.J.; Keith M. Roberts, Nyack; Richard L. Sumner, Pomona, both of N.Y.

[73] Assignee: Lecroy Corporation, Chestnut Ridge, N.Y.

[21] Appl. No.: 814,835

[22] Filed: Mar. 11, 1997

Related U.S. Application Data

[62] Division of Ser. No. 602,904, Feb. 16, 1996, Pat. No. 5,703,838.

[51] Int. Cl.$^6$ .................................................. G06M 3/00
[52] U.S. Cl. ............................... 377/20; 368/117; 368/118
[58] Field of Search ....................... 377/20; 368/117–120

[56] References Cited

U.S. PATENT DOCUMENTS

| | | | |
|---|---|---|---|
| 4,560,939 | 12/1985 | DeKarske et al. | ....... 327/151 |
| 5,062,128 | 10/1991 | Katsuragi et al. | ....... 377/20 |
| 5,703,838 | 12/1997 | Gorbics et al. | ....... 377/20 |

*Primary Examiner*—Margaret Rose Wambach
*Attorney, Agent, or Firm*—Frommer Lawrence & Haug LLP; William S. Frommer

[57] ABSTRACT

A Vernier delay line interpolator provides a precision level smaller than a clock period by delaying a periodic pulse signal in a delay line which has equally time-spaced taps and a total delay that is a harmonic H greater than 1 of the pulse period. The taps of the delay line are latched and decoded to derive the fraction of the pulse period that has passed. When the interpolator is combined with a coarse counter, misalignment between their outputs is prevented by having the coarse counter count both edges of the periodic pulse signal so as to provide redundant bits between the counter and the interpolator. If the redundant bits are not equal, the counter output is corrected before it is combined with the output of the interpolator.

14 Claims, 7 Drawing Sheets

5,838,754

VERNIER DELAY LINE INTERPOLATOR AND COARSE COUNTER REALIGNMENT

This application is a division of application Ser. No. 08/602,904, filed Feb. 16, 1996 now U.S. Pat. No. 5,703,838.

BACKGROUND OF THE INVENTION

The present invention relates to apparatus and method for measuring time intervals and, more particularly, to a Vernier delay line interpolator and apparatus and method for realigning a coarse counter and an interpolator.

Many particle physics experiments utilize time of flight measurements to infer the particle type, by measuring both the particle velocity and momentum, or to eliminate backgrounds. The measurement accuracy generally required for such experiments is 100 picoseconds or less, and this is usually met by an analog time-to-amplitude converter, followed by a conventional analog-to-digital converter.

Although time resolutions as low as 25 picoseconds currently are available in systems using this analog method, several disadvantages are associated therewith, including a limited maximum time range, which is generally less than 100 or 200 nanoseconds (ns), and calibration and integral non-linearity problems. Furthermore, the analog method allows a single measurement only, and must be operated in common start mode. Therefore, signals of interest in particle physics experiments must be delayed to allow time to form a trigger and to generate the common start signal. These difficulties and the expense of delay cable limit the application of high resolution time measurements to a small number of channels in most experiments.

One technique for increasing the maximum time range in time-to-digital converters (TDCs) is to combine a "coarse" counter with an interpolator. In such devices, the coarse counter counts the number of reference clock cycles which have passed in an interval of time to be measured, and the interpolator "interpolates" the number of fractions of one clock period which have elapsed when the event of interest occurs (i.e., at the end of the time interval).

One problem associated with this technique is that the resolutions of existing interpolators generally are limited by the frequency of the reference clock generators and the speed of the delay elements in the interpolators. In one technique, delay lines are used in an interpolator to subdivide the clock period. FIG. 1 of the drawings is an exemplary delay line which effectively subdivides the clock period by four when measuring the interval of time of a particular event. The delay line is comprised of a number of delay elements $20_1$, $20_2$, $20_3$ and $20_4$, each which imparts the same delay on the clock signal supplied thereto and the speed of the delay elements is adjusted to make the phase of the clock entering the delay line equal to the phase of the clock exiting the delay line. Thus, the total delay of the delay line equals exactly one clock period. A phase comparator 22 controls the speed (i.e., delay) of all of the delay elements $20_1 \ldots 20_4$. Then, by latching the state of the delay line at the beginning and end of the time interval, fractions of a clock period can be measured. Table 1 shows the possible states of a standard delay line and the fraction of a clock period they represent.

TABLE 1

States of Standard Delay Line

| Output of Delay Elements | Fraction of Clock period |
|---|---|
| 0011 | 0 |
| 1001 | ¼ |
| 1100 | ½ |
| 0110 | ¾ |

One difficulty encountered in existing time-to-digital converters which combine a coarse counter with an interpolator is their general inability to have time resolutions smaller than the amount of delay of each of the delay elements used in the interpolator. The minimum unit of time in the interpolator equals the delay of a single delay element therein. For example, if the fastest possible delay element, inverting or not, is 300 picoseconds (ps) in an interpolator, then the resolution of time measurements is limited to 300 ps.

Another problem with typical time-to-digital converters is their general inability to properly combine the outputs of a coarse counter and an interpolator to ensure that the resolution of the combined data is accurate. Counters typically have a large number of bits and each of those bits changes to the next counter state with a slightly different delay. Thus, the transition time of the counter is uncertain and the latched value (i.e., the output of the counter) is systematically incorrect by one or more fractional clock cycles which causes the improved resolution of the interpolator to be useless. In addition, the arrival times of the reference clock to the coarse counter and to the interpolator are not exactly the same because these devices are separate systems, thus further causing a misalignment between the interpolator and the counter.

OBJECTS OF THE INVENTION

Therefore, it is an object of the present invention to provide a Vernier delay line interpolator and apparatus and method for realigning a coarse counter and an interpolator which overcome the shortcomings of the above-described devices.

Another object of the present invention is to provide a Vernier delay line interpolator which has a resolution that is not limited by the speed of its delay elements.

A further object of the present invention is to provide a technique for realigning a coarse counter and an interpolator so as to accurately measure an interval of time.

Various other objects, advantages and features of to the present invention will become readily apparent to those of ordinary skill in the art, and the novel features will be particularly pointed out in the appended claims.

SUMMARY OF THE INVENTION

In accordance with one embodiment of the present invention, apparatus and method are provided for delaying a periodic pulse signal in a delay line having N equally time-spaced taps and having a total delay which is a harmonic H greater than 1 of the pulse period, latching each of the N taps, and decoding the latched taps to derive a value which represents a fraction of the pulse period that has passed. When the harmonic H and the number of taps of the delay line are relatively prime, the smallest interval of time measured is the pulse period divided by the number of taps of the delay line.

As an aspect of the present invention, the latched taps are decoded by de-permuting the latched taps to derive a de-permuted pattern consisting of N bits which correspond to the number of taps of the delay line, and identifying a leading edge transition of the de-permuted pattern as the number of 1/N fractions of the pulse period that have passed since the arrival of a last leading edge of the pulse signal to the delay line.

In accordance with another embodiment of the present invention, apparatus and method are provided for counting both the rising and falling edges of a periodic pulse signal to provide a count signal, interpolating the pulse signal to provide a time signal which represents a fraction of the pulse period, comparing the count signal and the time signal, adjusting the count signal in accordance with the compared result, and combining the adjusted count signal and the time signal to produce a combined time signal which represents an interval of time.

As one aspect of this embodiment, the time signal is adjusted prior to comparing the count and time signals, and the count signal is adjusted by incrementing the count signal by one when the least significant bit value of the count signal and the most significant bit value of the incremented time signal are different.

BRIEF DESCRIPTION OF THE DRAWINGS

The following detailed description, given by way of example and not intended to limit the present invention solely thereto, will best be appreciated in conjunction with the accompanying drawings, wherein like reference numerals denote like elements and parts, in which.

DETAILED DESCRIPTION OF CERTAIN PREFERRED EMBODIMENTS

Figure 1:
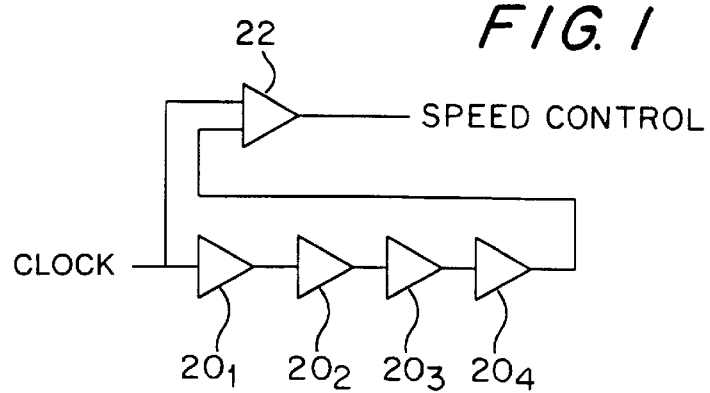
FIG. 1 is a schematic diagram of a delay line which subdivides a clock period by four.
Figure 2:
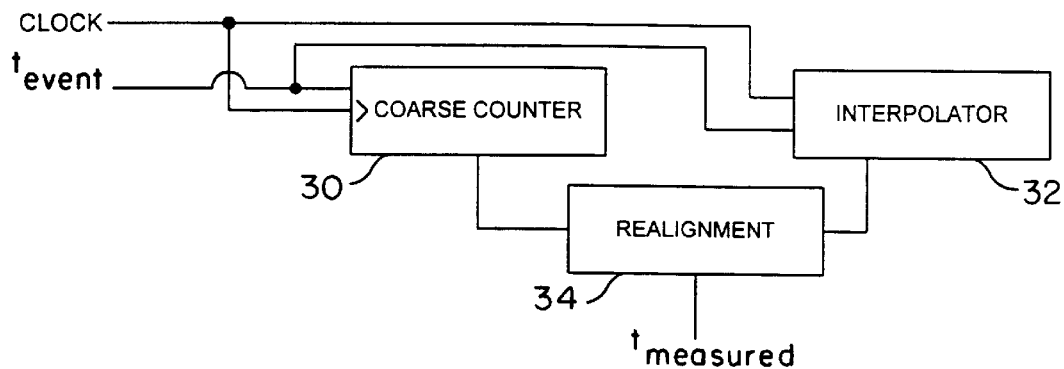
FIG. 2 is a schematic block diagram of a time interval measuring device including a coarse counter, an interpolator and a realignment circuit in accordance with the present invention.

Referring now to the drawings, FIG. 2 is a schematic block diagram of a time interval measuring device in accordance with the present invention and which is comprised of a coarse counter 30, a Vernier delay line interpolator 32 and a realignment circuit 34. A clock source (not shown) supplies a reference clock signal CLOCK to coarse counter 30 and to interpolator 32 which count and interpolate, respectively, the reference clock signal. The counted and interpolated values are latched at a time $t_{event}$, which represents the time at which a particular event occurs. Coarse counter 30, which may be a gray coded counter, counts twice for every clock period by advancing on both edges of reference clock signal CLOCK, as further discussed below. Interpolator 32 counts fractions of a clock period and realignment circuit 34 correctly combines the outputs of coarse counter 30 and interpolator 32, realigning any misalignment therebetween, to be further discussed.

Figure 3:
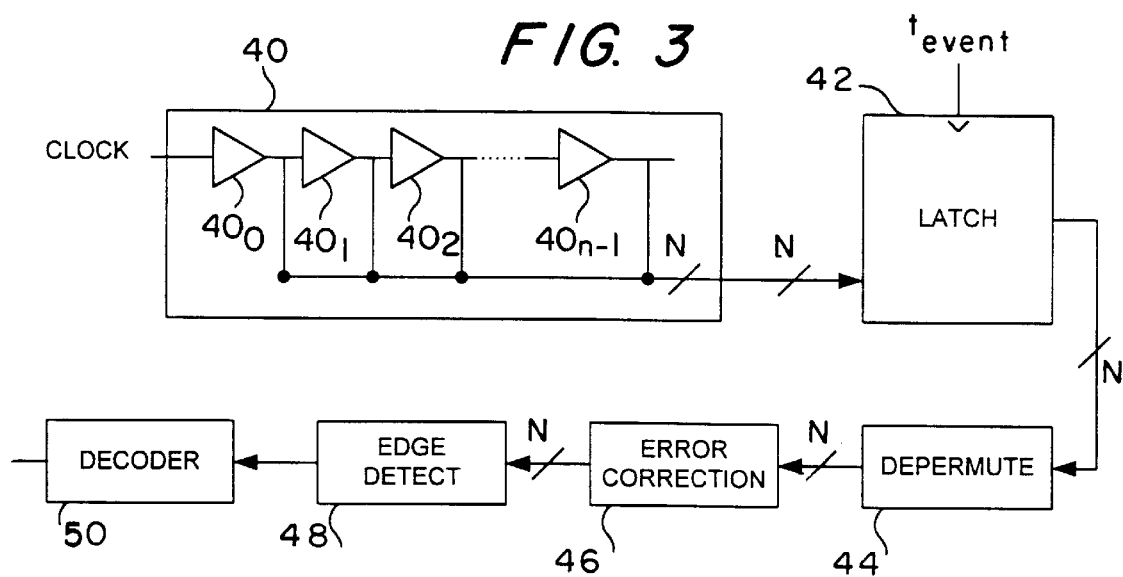
FIG. 3 is a functional block diagram of a Vernier delay line interpolator in accordance with the present invention.

FIG. 3 is a functional block diagram of Vernier delay line interpolator 32 in accordance with the present invention. Reference clock signal CLOCK is supplied to a tapped delay line 40 which is comprised of plural delay elements $40_0$, $40_1 \ldots 40_{N-1}$ and which is phase-locked to a higher harmonic of the reference clock. The total delay of tapped delay line 40 is made equal to an integer multiple H, H>1, of the clock period T of the reference clock where H represents the harmonic thereof.

Existing delay lines in prior art devices are phase-locked to the fundamental harmonic of the clock signal (i.e., the total delay of standard delay lines is equal to the clock period). However, and in accordance with the present invention, when the harmonic H and the number of delay elements N in the delay line are prime relative to each other (having no common factors), an interference effect occurs. This is similar to the Vernier scale found on calipers, except the intervals are in time rather than length. This interference effect creates equally spaced transitions at a frequency equal to the clock frequency times the number of delay elements.

For example, a delay line is comprised of sixteen non-inverting elements (N=16) and the reference clock signal has a period of 3.2 ns. If the delay line speed is adjusted by a feedback system until each delay element has a delay of 600 ps (D=600 ps), then the delay line is phase-locked to the third harmonic (H=3) of the reference clock. That is, the total length of the delay line (N*D=9.6 ns) is equal to three clock periods (H*T=9.6 ns). It is noted that controlling the speed of delay elements in a delay line is well known in the art, as exemplified by U.S. Pat. No. 4,482,826, issued to Ems et al. on Nov. 13, 1984, which is incorporated herein by reference, and therefore, further description thereof is omitted herein.

Table 2, shown below, illustrates the sixteen possible states of delay elements $40_0, 40_1 \ldots 40_{N-1}$, and it is seen that the three clock pulses in the delay line move left to right (i.e., through the delay line) as time passes.

TABLE 2

States of Delay Elements

| | Element | | | | | | | | | | | | | | | |
|---|---|---|---|---|---|---|---|---|---|---|---|---|---|---|---|---|
| Time (ns) | 0 | 1 | 2 | 3 | 4 | 5 | 6 | 7 | 8 | 9 | 10 | 11 | 12 | 13 | 14 | 15 |
| 0   | 1 | 0 | 0 | 1 | 1 | 1 | 0 | 0 | 0 | 1 | 1 | 0 | 0 | 0 | 1 | 1 |
| 0.2 | 1 | 0 | 0 | 0 | 1 | 1 | 0 | 0 | 0 | 1 | 1 | 1 | 0 | 0 | 1 | 1 |
| 0.4 | 1 | 0 | 0 | 0 | 1 | 1 | 1 | 0 | 0 | 1 | 1 | 1 | 0 | 0 | 0 | 1 |
| 0.6 | 1 | 1 | 0 | 0 | 1 | 1 | 1 | 0 | 0 | 0 | 1 | 1 | 0 | 0 | 0 | 1 |
| 0.8 | 1 | 1 | 0 | 0 | 0 | 1 | 1 | 0 | 0 | 0 | 1 | 1 | 1 | 0 | 0 | 1 |

TABLE 2-continued

States of Delay Elements

| Time (ns) | Element | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 1   | 1 | 1 | 0 | 0 | 0 | 1 | 1 | 1 | 0 | 0 | 1 | 1 | 1 | 0 | 0 | 0 |
| 1.2 | 1 | 1 | 1 | 0 | 0 | 1 | 1 | 1 | 0 | 0 | 0 | 1 | 1 | 0 | 0 | 0 |
| 1.4 | 1 | 1 | 1 | 0 | 0 | 0 | 1 | 1 | 0 | 0 | 0 | 1 | 1 | 1 | 0 | 0 |
| 1.6 | 0 | 1 | 1 | 0 | 0 | 0 | 1 | 1 | 1 | 0 | 0 | 1 | 1 | 1 | 0 | 0 |
| 1.8 | 0 | 1 | 1 | 1 | 0 | 0 | 1 | 1 | 1 | 0 | 0 | 0 | 1 | 1 | 0 | 0 |
| 2   | 0 | 1 | 1 | 1 | 0 | 0 | 0 | 1 | 1 | 0 | 0 | 0 | 1 | 1 | 1 | 0 |
| 2.2 | 0 | 0 | 1 | 1 | 0 | 0 | 0 | 1 | 1 | 1 | 0 | 0 | 1 | 1 | 1 | 0 |
| 2.4 | 0 | 0 | 1 | 1 | 1 | 0 | 0 | 1 | 1 | 1 | 0 | 0 | 0 | 1 | 1 | 0 |
| 2.6 | 0 | 0 | 1 | 1 | 1 | 0 | 0 | 0 | 1 | 1 | 0 | 0 | 0 | 1 | 1 | 1 |
| 2.8 | 0 | 0 | 0 | 1 | 1 | 0 | 0 | 0 | 1 | 1 | 1 | 0 | 0 | 1 | 1 | 1 |
| 3.0 | 0 | 0 | 0 | 1 | 1 | 1 | 0 | 0 | 1 | 1 | 1 | 0 | 0 | 0 | 1 | 1 |

As shown in Table 2, a first clock pulse is supplied at a time 0 ns to element 0 (element 40$_0$ shown in FIG. 3), which supplies the pulse after a 600 ps (0.6 ns) delay to element 1, which supplies the pulse after a 600 ps delay to element 2, etc. Further, a second (preceding) clock pulse is supplied from, for example, element 6 after a 600 ps delay to element 7, which supplies the clock pulse after a 600 ps delay to element 8, etc. Similarly, a third (preceding) clock pulse travels through the delay line. Since the harmonic number (e.g., H=3) and the number of delay lines (e.g., N=16) are prime relative to each other, only a single, rising edge transition (0-to-1 transition) in a delay element occurs every 200 ps. As shown in Table 2, rising edge transitions occur in element 11 at 0.2 ns, in element 6 and 0.4 ns, in element 1 at 0.6 ns, in element 12 at 0.8 ns, and so on. Therefore, Vernier delay line interpolator 32 produces a time signal with a 200 ps period, or at a frequency of 5 GHz, or 16*312.5 MHz, which is three times as fast as the 600 ps delay of each element. Since the reference clock has a frequency of 312.5 MHz (a 3.2 ns period), the sixteen delay elements effectively have increased the clock frequency by a factor of 16.

Equation 1 shows the relationship between the length of the smallest time interval measured $t_{LSB}$, the delay D of each element, the clock period T, the number of delay elements N and the harmonic number H.

$$t_{LSB} = \frac{D}{H} = \frac{T}{N} \tag{1}$$

Referring again to FIG. 3, delay elements 40$_0$, 40$_1$ . . . 40$_{N-1}$ are tapped to produce N outputs which are supplied to latch circuit 42 at a time $t_{event}$, and latch circuit 42 latches the values supplied thereto and supplies the latched values to depermute circuit 44. Latch 42 generally is comprised of at least N latches and since such latches are well known in the art, further description thereof is herein omitted except where necessary for an understanding of the present invention. The latched values of delay elements 40$_0$, 40$_1$ . . . 40$_{N-1}$ are shown in Table 2, previously discussed.

Depermute circuit 44 operates to depermute (or de-permutate) the latched state of delay line 40 to produce a depermuted pattern, which is shown in Table 3.

TABLE 3

Transitions of Delay Elements

| | Transition | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| | Element | | | | | | | | | | | | | | | |
| Time (ns) | 0 | 11 | 6 | 1 | 12 | 7 | 2 | 13 | 8 | 3 | 14 | 9 | 4 | 15 | 10 | 5 |
| 0   | 1 | 0 | 0 | 0 | 0 | 0 | 0 | 0 | 0 | 1 | 1 | 1 | 1 | 1 | 1 | 1 |
| 0.2 | 1 | 1 | 0 | 0 | 0 | 0 | 0 | 0 | 0 | 0 | 1 | 1 | 1 | 1 | 1 | 1 |
| 0.4 | 1 | 1 | 1 | 0 | 0 | 0 | 0 | 0 | 0 | 0 | 0 | 1 | 1 | 1 | 1 | 1 |
| 0.6 | 1 | 1 | 1 | 1 | 0 | 0 | 0 | 0 | 0 | 0 | 0 | 0 | 1 | 1 | 1 | 1 |
| 0.8 | 1 | 1 | 1 | 1 | 1 | 0 | 0 | 0 | 0 | 0 | 0 | 0 | 0 | 1 | 1 | 1 |
| 1   | 1 | 1 | 1 | 1 | 1 | 1 | 0 | 0 | 0 | 0 | 0 | 0 | 0 | 0 | 1 | 1 |
| 1.2 | 1 | 1 | 1 | 1 | 1 | 1 | 1 | 0 | 0 | 0 | 0 | 0 | 0 | 0 | 0 | 1 |
| 1.4 | 1 | 1 | 1 | 1 | 1 | 1 | 1 | 1 | 0 | 0 | 0 | 0 | 0 | 0 | 0 | 0 |
| 1.6 | 0 | 1 | 1 | 1 | 1 | 1 | 1 | 1 | 1 | 0 | 0 | 0 | 0 | 0 | 0 | 0 |
| 1.8 | 0 | 0 | 1 | 1 | 1 | 1 | 1 | 1 | 1 | 1 | 0 | 0 | 0 | 0 | 0 | 0 |
| 2   | 0 | 0 | 0 | 1 | 1 | 1 | 1 | 1 | 1 | 1 | 1 | 0 | 0 | 0 | 0 | 0 |
| 2.2 | 0 | 0 | 0 | 0 | 1 | 1 | 1 | 1 | 1 | 1 | 1 | 1 | 0 | 0 | 0 | 0 |
| 2.4 | 0 | 0 | 0 | 0 | 0 | 1 | 1 | 1 | 1 | 1 | 1 | 1 | 1 | 0 | 0 | 0 |
| 2.6 | 0 | 0 | 0 | 0 | 0 | 0 | 1 | 1 | 1 | 1 | 1 | 1 | 1 | 1 | 0 | 0 |
| 2.8 | 0 | 0 | 0 | 0 | 0 | 0 | 0 | 1 | 1 | 1 | 1 | 1 | 1 | 1 | 1 | 0 |
| 3.0 | 0 | 0 | 0 | 0 | 0 | 0 | 0 | 0 | 1 | 1 | 1 | 1 | 1 | 1 | 1 | 1 |

It is appreciated that only 0-to-1 transitions are of interest, as these are the leading edge of the acquisition clock, since use of the trailing edge is undesirable. If trailing edges were utilized, measurements would then depend on the duty cycle of the acquisition clock and the delay elements would have to preserve the duty cycle across the delay line. Therefore, only rising edge transitions (i.e., 0-to-1 transitions) are utilized.

As shown in Table 3, it is seen that the delay elements sequentially change from 0 to 1 in the following order: 0, 11, 6, 1, 12, 7, 2, 13, 8, 3, 14, 9, 4, 15, 10 and 5. Thus, the nth delay element to change is (n*11) mod 16. When the columns of Table 2 are rearranged in the order of the transitions of the delay elements, which results in the pattern shown in Table 3, the pattern becomes clear, and the rearrangement is a permutation by 11.

Equation 2 is the general form of the permutation required to unfold the data. It is appreciated that other permutations also will unfold the data. For example, a permutation of N–P will generate the mirror image of Table 3.

$$P = \text{int}\left[\frac{(H-1)N}{H}\right] + 1 \quad (2)$$

Thus, a latched copy of delay line 40 is interpreted to give the equivalent resolution of a faster delay line. After the pattern is depermuted in circuit 44, the depermuted pattern is supplied to an error correction circuit 46 which removes errors or "bubbles" from the data. For example, if the leading edge of the depermuted pattern is ". . . 1101000 . . .", error correction circuit 46 changes the "101" bubble to "110" to produce the error corrected pattern of ". . . 11110000 . . .".

This process of removing bubble errors from the depermuted pattern is more properly called error mitigation. It is appreciated that some information has been lost and is not restored by this procedure, but the error is minimized. Further, the absence of bubble errors in the depermuted pattern reduces the demands on the next computation.

The error corrected pattern is supplied to an edge detector circuit 48 which identifies the leading edge (1-to-0) transition of the depermuted pattern (when reading left to right in Table 3). For example, latch 42 latches the state of delay line 40 at a given time $t_{event}$, resulting in, for example, the bit pattern "1100011000111001". From Table 2, it is seen that this bit pattern occurs at time 0.8 ns. In an alternative embodiment of the present invention, a lookup table can be utilized to determine the time at which a particular event occurs. However, due to the possibly large number of delay elements (e.g., 64, 128, 256, etc.) that may be utilized in a delay line, the present invention contemplates a mathematical approach to decode the data.

Latch 42 supplies the bit pattern to depermute circuit 44 which, using an appropriate permutation equation, depermutes the data to produce the bit pattern "1111100000000111", such as shown in Table 3 at 0.8 ns. Assuming there are no errors, edge detector circuit 48 identifies transition 4 as the leading edge in the depermuted pattern, such as shown in Table 3. The identified leading edge transition is supplied to a decoder circuit 50 which transforms the transition number into time data representative of the amount of time that has passed since the arrival of the last leading edge of the reference clock. Since there are N transitions in one clock period (T) for N delay elements, the transition number (A) identifies the number 1/N of a clock period that have passed. Thus, the amount of time (time) that has passed since the arrival of the last leading edge of the reference clock is (A*T)/N. In the above example, A=4, T=3.2 ns, N=16, and therefore, time=(4*3.2 ns)÷16=0.8 ns.

Figure 4:
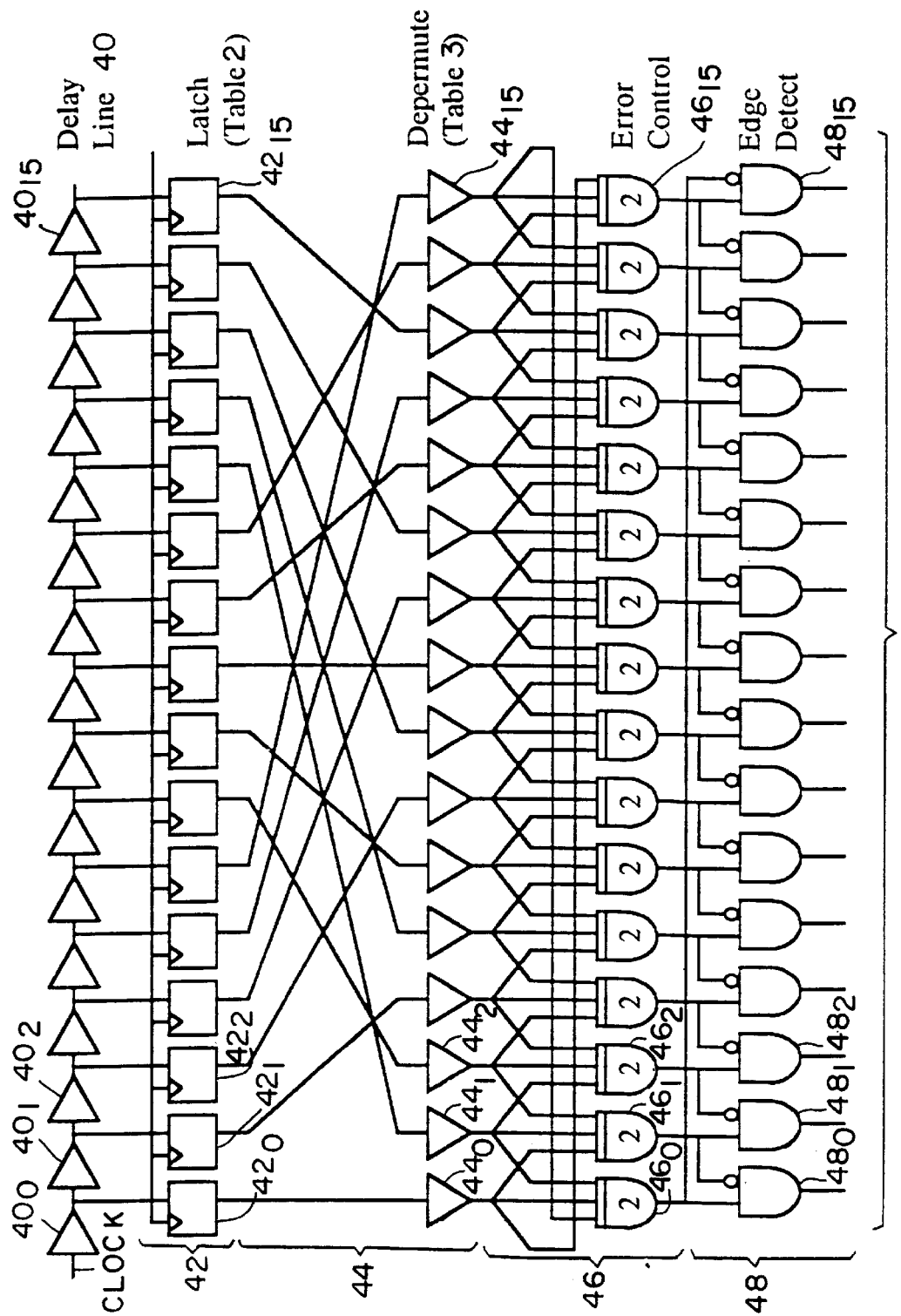
FIG. 4 is a detailed schematic diagram of the Vernier delay line interpolator of FIG. 3 in accordance with the present invention.

FIG. 4 is a detailed schematic diagram of the Vernier delay line interpolator shown in FIG. 3 in accordance with the present invention. Delay line 40 is comprised of sixteen non-inverting buffers $40_0$, $40_1$, $40_2$ . . . $40_{15}$ (although inverting buffers may be used), latch circuit 42 is comprised of sixteen latches $42_0$, $42_1$, $42_2$ . . . $42_{15}$, depermute circuit 44 is comprised of sixteen buffers $44_0$, $44_1$, $44_2$ . . . $44_{15}$, error correction circuit 46 is comprised of sixteen majority logic circuits $46_0$, $46_1$, $46_2$ . . . $46_{15}$, and edge detector circuit 48 is comprised of sixteen two input (one complementary) AND gates $48_0$, $48_1$, $48_2$ . . . $48_{15}$.

Delay line 40 and latch circuit 42 operate in the manner described above. Depermute circuit 44 hard-wires the output of each latch $42_0$, $42_1$, $42_2$ . . . $42_{15}$, to the appropriate buffer $44_0$, $44_1$, $44_2$ . . . $44_{15}$ so as to depermute the delay line output bit pattern. That is, the output of a latch is supplied to the buffer which corresponds to the transition number of that latch (i.e., delay element) shown in Table 3.

Each output buffer $44_0$, $44_1$, $44_2$ . . . $44_{15}$ supplies the depermuted bit value to a corresponding majority logic circuit and also to the preceding and succeeding majority logic circuits in error correction circuit 46. Output buffer $44_0$ supplies a depermuted bit signal to majority logic circuit $46_0$, to the preceding majority logic circuit $46_{15}$, and to the succeeding majority logic circuit $46_1$. Output buffer $44_1$ supplies a depermuted bit signal to majority logic circuits $46_0$, $46_1$ and $46_2$. Output buffers $44_2$ . . . $44_{15}$ similarly supply their respective outputs to 3 adjacent majority logic circuits. Each majority logic circuit then operates to remove a "bubble" from the data by supplying as an output the majority value supplied thereto. For example, if the three bit values supplied to majority logic circuit $46_1$ are 1, 1, 0 from output buffers $44_0$, $44_1$ and $44_2$, respectively, then majority logic circuit $46_1$ would supply a "1" as an output (no change). However, a bit pattern of "101" (a "bubble") would result in the output of a "1" from the majority logic circuit, thereby removing the bubble from the pattern.

As an alternative to the disclosed embodiment, each majority logic circuit may be a "3 of 5" or a "4 of 7", etc., majority logic circuit wherein the output represents the majority of the 5 or 7 inputs, respectively. Although such circuits generally are more complex than standard 3-input majority logic circuits, they generally provide a more fault tolerant system with no loss of precision.

Error correction circuit 46 supplies the error corrected bit values to gates $48_0$, $48_1$ . . . $48_{15}$ in edge detector circuit 48 which detects the leading edge of the clock in the data. One of the logic gates in edge detector circuit 48 supplies a high output to identify the leading edge and the remaining fifteen logic gates supply a low output. Decoder 50 (shown in FIG. 3) translates the sixteen signals into time data, as previously discussed.

To achieve a large dynamic range, the Vernier delay line interpolator of the present invention is combined with a coarse counter, such as shown in FIG. 2 of the drawings. When the outputs of a coarse counter and an interpolator are combined in existing systems, there is often the problem that a systematic misalignment between the two devices causes the interpolators output to be meaningless, as previously discussed. Therefore, and in accordance with the present invention, coarse counter 30 is designed (or programmed) to count twice for every clock period of reference clock signal CLOCK so as to have an overlapping (or redundant) data bit between the coarse counter and the interpolator. Counter 30 counts twice for every clock period by advancing on both edges of the reference clock, as previously mentioned, and although the use of the falling edge of the reference clock adds additional sources of error dependent on the clock duty cycle, such errors are removed or minimized if the duty cycle errors are not too large.

Figure 5:
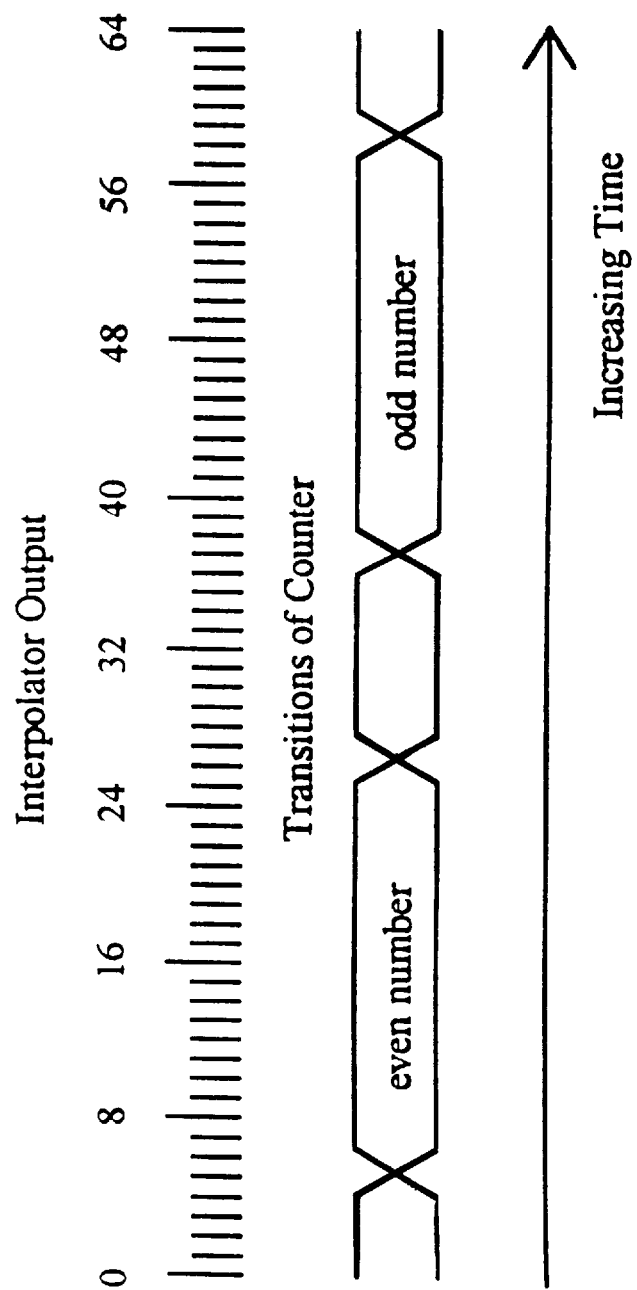
FIG. 5 is a timing diagram comparing the outputs of the interpolator and the coarse counter for one clock period.

FIG. 5 is a timing diagram showing the output of coarse counter 30 and interpolator 32 for one entire clock period. The interpolator divides each clock period into, for example, 64 fractions, and thus, provides as an output 6 bits of data to represent the interpolated value. Coarse counter 30 supplies as an output plural bits (e.g., 6, 8, 12, 16, etc.) of data where the least significant bit (LSB) of counter 30 overlaps interpolator 32's most significant bit (MSB). Therefore, the even numbers from counter 30 (i.e., LSB=0) is associated with interpolator values 0 through 31 and the odd numbers from counter 30 (i.e., LSB=1) are associated with interpolator values 32–63. The gray areas in FIG. 5 represent the uncertainty of the transition time of counter 30.

Since bits in counter 30 change to the next state with different delays, the counter may change either too soon or too late, thereby causing the counter and the interpolator to be misaligned. For example, if counter 30 is odd and interpolator 32 is between 16 and 31, the counter changed too soon. As another example, if the counter is even and the interpolator is between 32 and 47, the counter changed too late. In accordance with the present invention, counter 30 and interpolator 32 are realigned by decrementing the counter by one when the counter changes too soon and by incrementing the counter by one when it changes too fast. After correction of the counter, the least significant bit of the counter and the most significant bit of the interpolator are the same, and thus, the two devices are aligned.

Table 4 is a summary of the actions to be performed for the various values of the interpolator and the counter.

TABLE 4

| INTERPOLATOR | COUNTER | ACTION |
|---|---|---|
| 0–15 | even | no action |
| 0–15 | odd | increment |
| 16–31 | even | no action |
| 16–31 | odd | decrement |
| 32–47 | even | increment |
| 32–47 | odd | no action |
| 48–63 | even | decrement |
| 48–63 | odd | no action |

Figure 6:
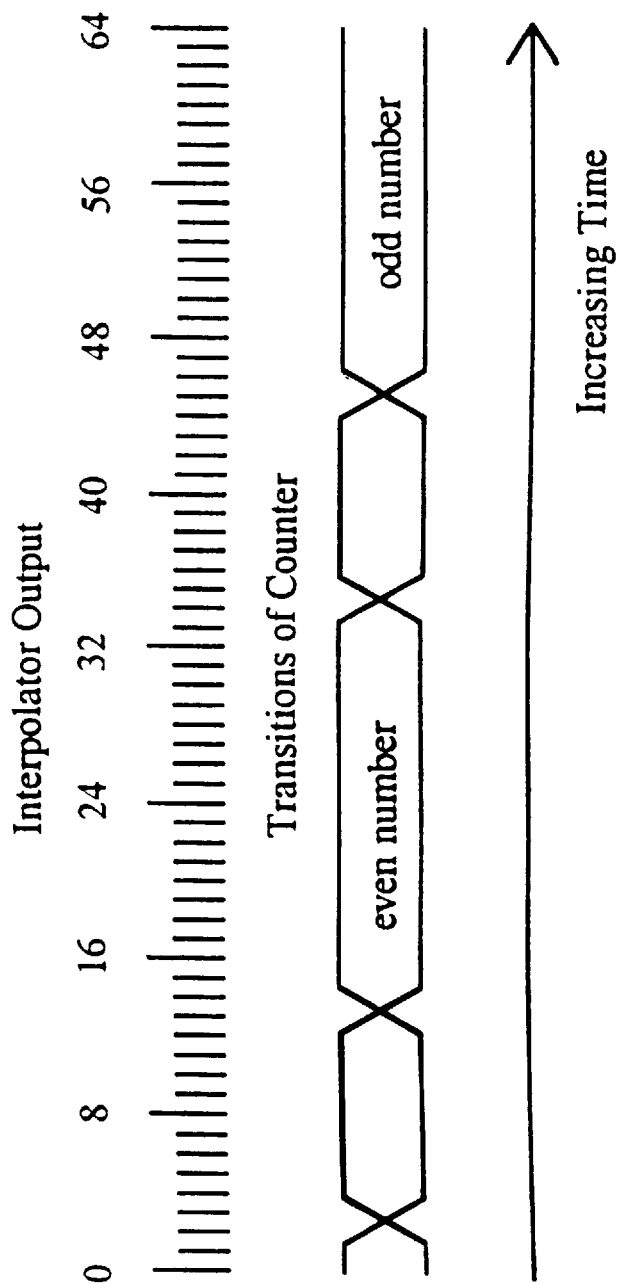
FIG. 6 is a timing diagram comparing the outputs of the advanced interpolator and the delayed coarse counter.

The procedure of correcting counter 30 is simplified by ensuring that counter 30 is always late. FIG. 6 is a timing diagram of the outputs of counter 30 and interpolator 32 when counter 30 is delayed by an amount equal to 8 units of interpolator 32, that is, ⅛ of a clock period in the illustrated example. Here, the latched output of counter 30 never has to be decremented, but is only incremented when counter 30 and interpolator 32 are misaligned. Table 5 is a summary of the actions necessary to correct counter 30 when the output of the counter is delayed by 8. As is appreciated, implementation of the actions shown in Table 5 is significantly simpler than that of Table 4.

TABLE 5

| INTERPOLATOR | COUNTER | ACTION |
|---|---|---|
| 0–31 | odd | increment |
| 0–31 | even | no action |
| 32–63 | odd | no action |
| 32–63 | even | increment |

Figure 7:
FIG. 7 illustrates the courses of actions to be taken for the various values of the interpolator and the coarse counter in accordance with the present invention.
Figure 7:
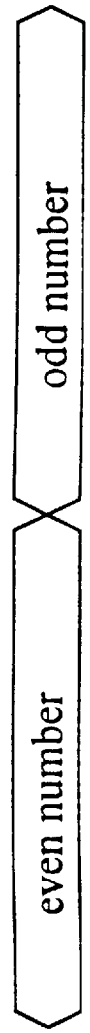

To simplify implementation of the realignment of counter 30 and interpolator 32 further, instead of delaying counter 30 by 8 as described above, interpolator 32 is advanced by adding a fixed number to the output of the interpolator. FIG. 6 also is a timing diagram of the outputs of counter 30 and interpolator 32 when the interpolator is advanced by 8, and FIG. 7 illustrates the courses of actions to be taken for the various values of interpolator 32 and counter 30.

Finally, the advancing of interpolator 32 by 16, rather than by 8, moves the uncertainty area (the gray area) in the counter as far as possible from the 31–32 and 63–0 boundaries, thus providing the greatest margin of safety.

Figure 8:
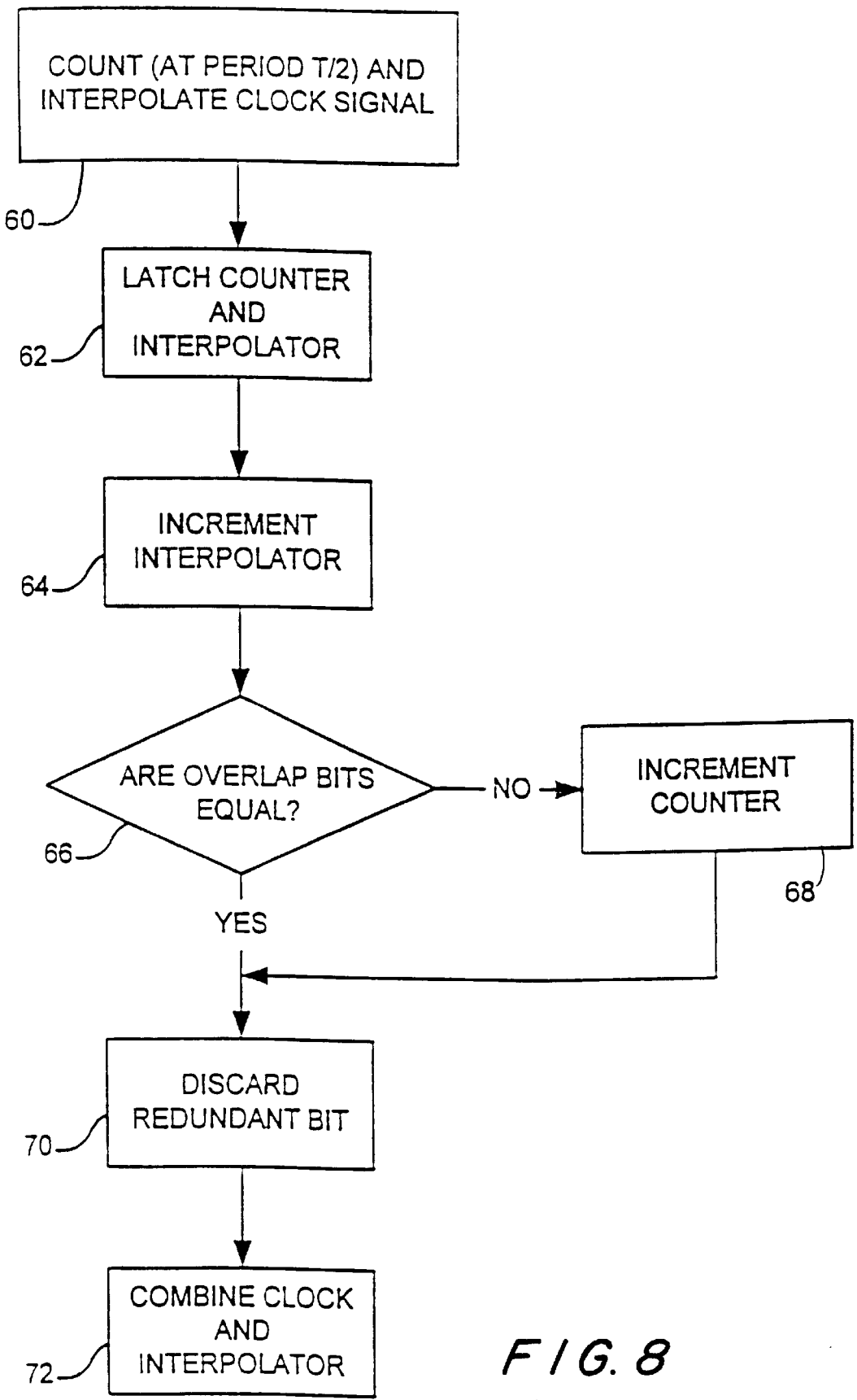
FIG. 8 is a flowchart for realigning the outputs of the coarse counter and the interpolator.

FIG. 8 is a flowchart of the procedure for realigning coarse counter 30 and Vernier delay line interpolator 32 in accordance with the present invention. A reference clock signal having a period T is counted twice for each clock period and is interpolated to produce fractions of the clock period at instruction 60. The outputs of counter 30 and interpolator 32 are latched at a particular time at instruction 62 and the latched value of interpolator 32 is incremented at instruction 64 so that there is the greatest margin between the uncertainty areas in counter 30 and the 0 and midway boundaries of interpolator 32, previously discussed. It is determined whether the least significant bit of the latched counter value and the most significant bit of the incremented interpolated value match (i.e. are equal), at inquiry 66, and if so, the procedure proceeds to instruction 70. However, when the two bits are not equal, the latched counter value is incremented by one at instruction 68 in order to realign the outputs of counter 30 and interpolator 32. Then, at instruction 70, one of the redundant bits, that is, the LSB of the latched counter value or the MSB of the incremented interpolated value, is discarded. The counter value and the interpolated value are combined at instruction 72 to produce a time value indicative of the amount of time between the start of the counting and interpolating of the reference clock and the latching of the outputs of counter 30 and interpolator 32.

Figure 9:
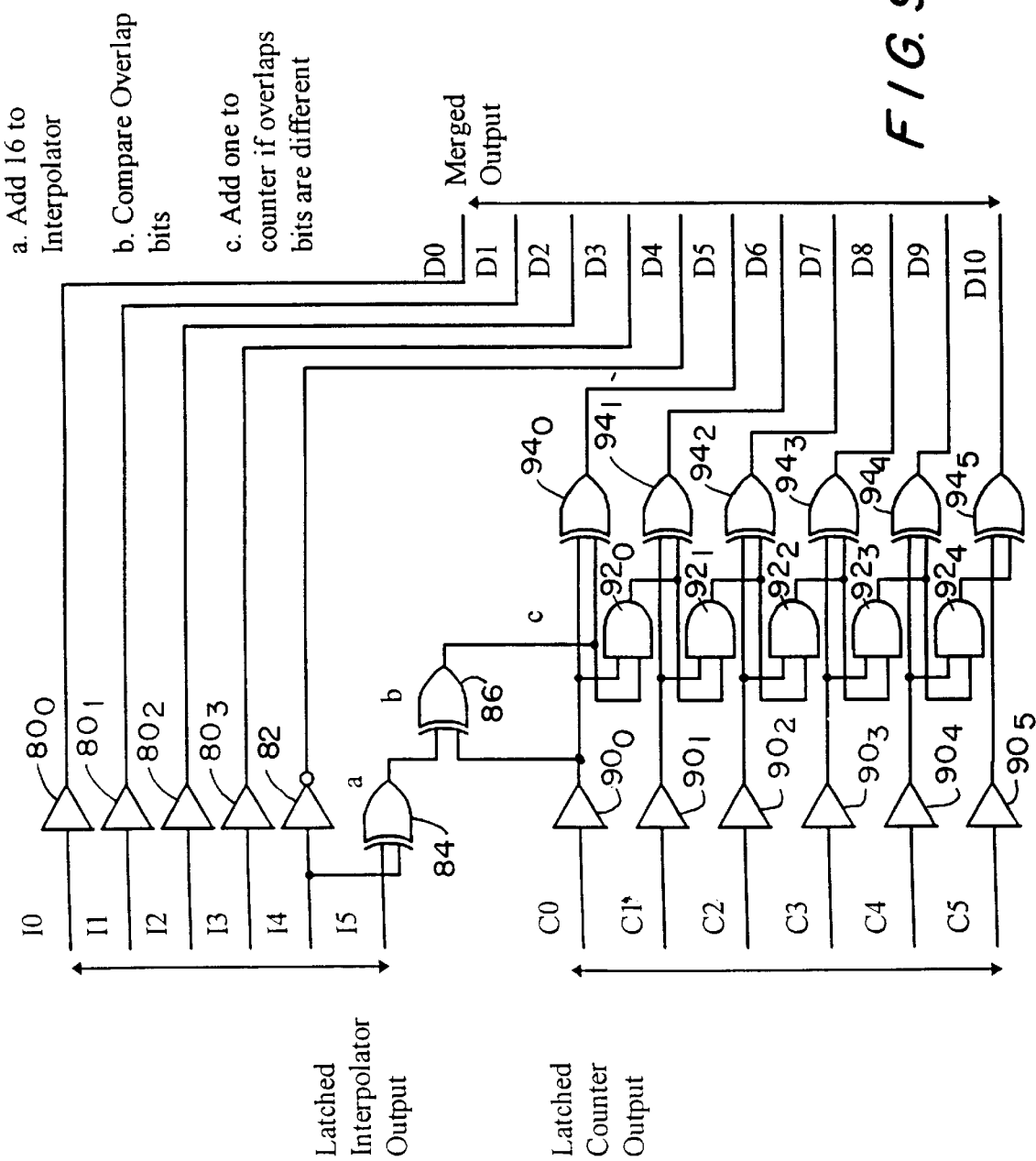
FIG. 9 is a detailed schematic diagram of realignment circuit 34 of FIG. 2 in accordance with the present invention.

FIG. 9 is an exemplary schematic circuit diagram of realignment circuit 34 shown in FIG. 2 which implements the realignment of coarse counter 30 and interpolator 32 in accordance with the present invention. In the illustrative circuit, a 6-bit interpolator (64 states) and a 6-bit counter (advancing twice per clock) supply their outputs as signals I0–I5 and C0–C5, respectively.

Bit (i.e., signal) I5 is the most significant bit and bit I0 is the least significant bit of the interpolator's output. Bits I0–I3 are supplied to non-inverting buffers $80_0$–$80_3$, respectively, bit I4 is supplied to an inverting buffer 82 and also is supplied to a XOR gate 84, and bit I5 is supplied to the other input of XOR gate 84. Invertor 82 and XOR gate 84 operate to effectively add 16 to the value of the output of the interpolator and FIG. 9 refers to this function as reference "a".

Counter output bits C0–C5 are supplied to non-inverting buffers $90_0$–$90_5$, respectively, wherein bit C0 is the least significant bit and bit C5 is the most significant bit of the counter output. The output of XOR gate 84 (which represents the most significant bit of the interpolator output plus 16) is supplied to one input of a XOR gate 86 and the output of buffer 90₀ is supplied to the other input of XOR gate 86. As referenced as "b" in FIG. 9, XOR gate 86 compares the values of the two overlapping bits supplied thereto and supplies as an output a "1" (a high signal) when the overlapping bits are different and supplies a "0" (a low signal) when the two overlapping bits are the same.

Counter output bits C0–C5 are supplied via buffers 90₀–90₅ to XOR gates 94₀–94₅, respectively, counter output bits C0–C4 also are supplied to AND gates 92₀–92₄, respectively, and the output of XOR gate 86 is supplied to both XOR gate 94₀ and AND gate 92₀. Further, the outputs of AND gates 92₀–92₄ are supplied to the other input of XOR gates 94₁–94₅, respectively, and the outputs of AND gates 92₀–92₃ also are supplied to the second input of AND gates 92₁–92₄, respectively. As is well known in the art, and which is referenced as "c" in FIG. 9, AND gates 92₀–92₄ and XOR gates 94₀–94₅ effectively add 1 to the output of the coarse counter when the output of XOR gate 86 is "1", and thus, further description thereof is omitted.

Finally, the outputs of buffers 80₀–80₃ and inverting buffer 82 are combined with the outputs of XOR gates 94₀–94₅ to produce an 11-bit D0–D10 count value representative of both the count of the coarse counter and the interpolated value of the interpolator. And, as discussed above, the coarse counter and the interpolator are realigned in the circuit of FIG. 9, and thus, the improved precision of the interpolator is preserved when the outputs of the counter and interpolator are combined.

The circuit of FIG. 9 in combination with a coarse counter and the above-described Vernier delay line interpolator provides time resolutions as small as, for example, 50 ps while having relatively large maximum time ranges.

While the present invention has been particularly shown and described in conjunction with preferred embodiments thereof, it will be readily appreciated by those of ordinary skill in the art that various changes may be made without departing from the spirit and scope of the invention. For example, although an improved Vernier delay line interpolator is described herein, the present invention is not limited to this type of interpolator and may realign a coarse counter with other types of interpolators.

As another example, although the present discussion is directed to having the coarse counter count twice for each clock period so as to have the least significant bit of the coarse counter overlap the most significant bit of the interpolator, the present invention is not limited solely to this arrangement and may be applied to those situations where the interpolator divides two clock periods into fractions so as to result in an overlapping bit between the coarse counter and the interpolator.

Still further, although the disclosed Vernier delay line interpolator is described as utilizing non-inverting buffers as delay elements therein, other types of delay means, such as inverting buffers or active circuits, may also be used by a device embodying the present invention.

As yet another example, although a direct wiring method has been shown as effecting the permutation in the depermute circuit, other methods and circuits may also be used to implement the de-permuting function performed by the depermute circuit.

Therefore, it is intended that the appended claims be interpreted as including the embodiments described herein, the alternatives mentioned above, and all equivalents thereto.

What is claimed is:

1. Apparatus for measuring an interval of time, comprising:
   a counter for counting both rising and falling edges of a periodic pulse signal having a predetermined pulse period and providing as an output a count signal indicative of the number of counted edges;
   an interpolator for receiving said periodic pulse signal and providing a time signal representative of a fraction of said pulse period that has passed since the receipt of a pulse;
   realignment means for realigning said counter and said interpolator by comparing said count signal and said time signal and adjusting said count signal in accordance with this comparison; and
   means for combining said adjusted count signal and said time signal to produce a combined time signal representative of an interval of time.

2. The apparatus of claim 1, further comprising means for advancing the time signal output from the interpolator; wherein said count signal and said advanced time signal each represents a plurality of bit values, and said realignment means compares a least significant bit value of said count signal and a most significant bit value of said advanced time signal and increments said count signal by 1 if the compared bit values are different.

3. The apparatus of claim 2, wherein the time signal is advanced by a value corresponding to a second most significant bit of said time signal.

4. The apparatus of claim 2, wherein said means for combining combines all of the bit values of said count signal and all but the most significant bit value of said time signal to produce said combined time signal.

5. The apparatus of claim 1, wherein said interpolator is comprised of:
   a tapped delay line for receiving said periodic pulse signal and including a plurality of taps at equal time-intervals along the delay line, the total delay of said delay line being a harmonic H greater than 1 of the pulse period;
   latch means for latching the taps of said delay line; and
   decoding means for decoding the latched taps to derive a value representative of said fraction of said pulse period.

6. The apparatus of claim 5, wherein the harmonic H and the number of taps of the delay line of said interpolator are prime relative to each other.

7. The apparatus of claim 6, wherein the tapped delay line of said interpolator includes N delay elements, each delay element having a delay length D and having an output representing a respective one of said taps of said delay line, T is the pulse period and $t_{LSB}$ represents the smallest interval of time measured by said interpolator, and having the relationship:

$$t_{LSB} = \frac{D}{H} = \frac{T}{N} \tag{7}$$

8. A method for measuring an interval of time, comprising the steps of:
   counting both rising and falling edges of a periodic pulse signal having a predetermined pulse period to provide a count signal indicative of the number of counted edges;
   interpolating said periodic pulse signal to provide a time signal representative of a fraction of said pulse period that has passed since receipt of a pulse;
   comparing said count signal and said time signal;

adjusting said count signal in accordance with the comparison of the count and time signals; and combining the adjusted count signal and the time signal to produce a combined time signal representative of an interval of time.

9. The method of claim 8, further comprising the step of advancing the time signal prior to comparing the count and time signals; wherein the count signal and the advanced time signal each represents a plurality of bit values; and said step of comparing is carried out by comparing a least significant bit value of said count signal and a most significant bit value of said advanced time signal and said step of adjusting said count signal increments said count signal by 1 if the compared bit values are different.

10. The method of claim 9, wherein the step of advancing the time signal is carried out by advancing the time signal by a value corresponding to a second most significant bit thereof.

11. The method of claim 9, wherein said step of combining is carried out by combining all of the bit values of said count signal and all but the most significant bit value of said time signal to produce said combined time signal.

12. The method of claim 8, wherein said step of interpolating includes the steps of:

delaying said pulse signal in a delay line having N equally time-spaced taps, the total delay of said delay line being a harmonic H greater than 1 of the pulse period;

latching each of the taps of said delay line; and decoding the latched taps to derive said time signal representative of said fraction of said pulse period that has passed.

13. The method of claim 12, wherein the harmonic H and the number of taps of the delay line are prime relative to each other.

14. The method of claim 13, wherein the pulse signal is delayed by an amount D between adjacent taps of said delay line, T is the pulse period, and $t_{LSB}$ represents the smallest interval of time measured in said method, and having the relationship:

$$t_{LSB} = \frac{D}{H} = \frac{T}{N} \tag{8}$$

* * * * *